(12) United States Patent
Soliman et al.

(10) Patent No.: US 12,111,340 B2
(45) Date of Patent: Oct. 8, 2024

(54) APPARATUS COMPRISING A COMPARATOR DEVICE AND METHOD FOR OPERATING AN APPARATUS COMPRISING A COMPARATOR DEVICE

(71) Applicant: Robert Bosch GmbH, Stuttgart (DE)

(72) Inventors: Taha Ibrahim Ibrahim Soliman, Renningen (DE); Tobias Kirchner, Ludwigsburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 2 days.

(21) Appl. No.: 18/178,744

(22) Filed: Mar. 6, 2023

(65) Prior Publication Data

US 2023/0288458 A1    Sep. 14, 2023

(30) Foreign Application Priority Data

Mar. 10, 2022   (DE) ..................... 10 2022 202 425.7

(51) Int. Cl.
  *G01R 19/257*   (2006.01)
  *G01R 19/00*    (2006.01)
(52) U.S. Cl.
  CPC ....... *G01R 19/257* (2013.01); *G01R 19/0038* (2013.01)

(58) Field of Classification Search
  CPC .................................................. G01R 19/257
  USPC ......................................................... 327/77
  See application file for complete search history.

(56) References Cited

U.S. PATENT DOCUMENTS 6,150,967 A * 11/2000 Nakamura ......... G01R 19/2509
                                                   341/135

FOREIGN PATENT DOCUMENTS

DE    102021208010 A1    1/2022

* cited by examiner

*Primary Examiner* — Tomi Skibinski
(74) *Attorney, Agent, or Firm* — NORTON ROSE FULBRIGHT US LLP; Gerard A. Messina

(57) ABSTRACT

An apparatus including a first comparator device. The first comparator device includes a first reference current providing device for providing a first reference current and a first comparison current providing device for providing a first comparison current. The first comparator device is configured to compare the first reference current with the first comparison current to obtain a first comparison result and output a first output signal characterizing the first comparison result based on the first comparison result.

15 Claims, 10 Drawing Sheets

APPARATUS COMPRISING A COMPARATOR DEVICE AND METHOD FOR OPERATING AN APPARATUS COMPRISING A COMPARATOR DEVICE

CROSS REFERENCE

The present application claims the benefit under 35 U.S.C. § 119 of German Patent Application No. DE 10 2022 202 425.7 filed on Mar. 10, 2022, which is expressly incorporated herein by reference in its entirety.

FIELD

The present invention relates to an apparatus comprising a comparator device.

The present invention also relates to a method for operating an apparatus comprising a comparator device.

SUMMARY

Embodiment examples of the present invention include an apparatus comprising a first comparator device, wherein the first comparator device comprises a first reference current providing device for providing a first reference current and a first comparison current providing device for providing a first comparison current, and wherein the first comparator device is configured to compare the first reference current with the first comparison current to obtain a first comparison result and output a first output signal characterizing the first comparison result based on the first comparison result.

In other embodiment examples of the preset invention, it is provided that the apparatus comprises at least one second comparator device, wherein the second comparator device comprises a second reference current providing device for providing a second reference current and a second comparison current providing device for providing a second comparison current, and wherein the second comparator device is configured to compare the second reference current with the second comparison current to obtain a second comparison result and output a second output signal characterizing the second comparison result based on the second comparison result. In other embodiment examples, this makes it possible to provide a, for example two-stage, analog-to-digital converter device, for instance, wherein a first stage, e.g., corresponding to a most significant bit (MSB), can be implemented by means of the first comparator device, for example, and wherein a second stage, e.g., corresponding to a least significant bit (LSB), can be implemented by means of the second comparator device, for example.

In other embodiment examples of the present invention, it is provided that the second comparator device is configured to receive the first output signal and to form the second comparison result based on the second reference current and the second comparison current and the first output signal.

In other embodiment examples of the present invention, it is provided that the second comparator device is configured to provide a current associated with the first comparator device based on the first output signal and include the current associated with the first comparator device in the comparison, wherein the second comparator device comprises a current source which can be controlled based on the first output signal, for example, in order to provide the current associated with the first comparator device. Thus, for example when an analog-to-digital converter device is provided, a state change, e.g., of the MSB, can be taken into account, e.g., by influencing a current comparison of the LSB stage based on the current associated with the first comparator device.

In other embodiment examples of the present invention, it is provided that the second comparator device is configured to form a sum of the second comparison current and the current associated with the first comparator device and to subtract the second reference current from the sum.

In other embodiment examples of the present invention, it is provided that the second comparator device is configured to supply the second comparison current and the current associated with the first comparator device to a circuit node associated with the second comparator device and to drain the second reference current from the circuit node associated with the second comparator device. In other embodiment examples, an electrical potential of the circuit node associated with the second comparator device can be used as the second output signal, for example. In other embodiment examples, this applies similarly also for the first comparator device, for example, or, in the case of multiple (e.g., more than two) comparator devices, for the multiple comparator devices available.

In other embodiment examples of the present invention, it is provided that the apparatus comprises an n number of, $n=1, 2, 3, \ldots$, comparator devices (e.g., also comprising the first and/or second comparator device already mentioned above as examples), wherein the nth comparator device comprises an nth reference current providing device for providing an nth reference current and an nth comparison current providing device for providing an nth comparison current, and wherein the nth comparator device is configured to compare the nth reference current with the nth comparison current to obtain an nth comparison result and output an nth output signal characterizing the nth comparison result based on the nth comparison result. In other words, in other embodiment examples, a plurality or all of the comparator devices of the apparatus can therefore have an at least partially identical or comparable structure, for example with regard to the respective reference current providing device and/or the respective comparison current providing device.

In other embodiment examples of the present invention, it is provided that a kth comparator device, $k=2, \ldots, n$, of the n number of comparator devices is configured to receive at least one output signal of a (k−1)th comparator device and form the kth comparison result based on the kth reference current and the kth comparison current and the at least one output signal of the (k−1)th comparator device. Thus, in other embodiment examples, it is possible to carry out comparisons of some stages or comparator devices based on the state or output signal of at least one other comparator device.

In other embodiment examples of the present invention, it is provided that a kth comparator device, $k=2, \ldots, n$, of the n number of comparator devices is configured to receive respective output signals of each ith comparator device, $i=k-1, k-2, \ldots, 1$ and form the kth comparison result based on the kth reference current and the kth comparison current and the respective output signals of each ith comparator device. Thus, in other embodiment examples, it is possible to carry out comparisons of some stages or comparator devices based on the state or output signal of some other stages or comparator devices, for example in applications in the field of analog-to-digital converter devices according to other embodiment examples, based on the state or output signal of such stages of the analog-to-digital converter device which precede the kth stage, e.g., in a sequence of values from MSB to LSB (thus affecting the higher-order stages than the k-stage).

In other embodiment examples of the present invention, it is provided that the kth comparator device is configured to provide a current associated with the ith comparator devices based on the respective output signals of each one of the ith comparator devices and include the current associated with the ith comparator devices in the comparison, wherein the kth comparator device, for example, is configured to form a sum of the kth comparison current and the current associated with the ith comparator devices and to subtract the kth reference current from the sum.

In other embodiment examples of the present invention, it is provided that at least one nth comparator device comprises a series circuit consisting of a first transistor and a second transistor, wherein the first transistor forms at least part of the nth reference current providing device and wherein the second transistor forms at least part of the nth comparison current providing device.

In other embodiment examples of the present invention, it is provided that the first transistor and/or the second transistor is configured as a field effect transistor, for example a MOSFET, e.g., as an N-channel MOSFET or as a P-channel MOSFET. In other embodiments, the drain-source paths of the first transistor and the second transistor, for example, are then connected in series in the sense of the series circuit described above as an example.

In other embodiment examples of the present invention, it is provided that the first transistor and/or the second transistor is configured as a, for example NPN or PNP type, bipolar transistor. In other embodiments, the collector-emitter paths of the first transistor and the second transistor, for example, are then connected in series in the sense of the series circuit described above as an example.

In other embodiment examples of the present invention, it is also possible to respectively provide a (e.g., different) controllable current source or controllable electrical resistance in place of the first transistor and/or the second transistor, for example.

In other embodiment examples of the present invention, it is provided that the series circuit is assigned a compensation device for compensating a voltage drop, for example on the first transistor, wherein the compensation device is connected in series with the series circuit, for example.

In other embodiment examples of the present invention, it is provided that a circuit node of the series circuit located between the first transistor and the second transistor can be at least temporarily subjected to the current associated with the ith comparator devices.

In other embodiment examples of the present invention, it is provided that the nth reference current providing device is part of a first current mirror device. In other embodiment examples, it is provided that the first current mirror device supplies a respective reference current to a plurality of the comparator devices, for example. In other embodiment examples, the first current mirror device can be configured as a current mirror device comprising one input and an n number of outputs, for example, wherein the first current mirror device can be supplied via its input with a reference current, e.g., a base reference current, for example, and wherein the first current mirror device outputs at its n number of outputs a respective nth reference current derived from the reference current, e.g., the base reference current, for example.

In other embodiment examples of the present invention, it is provided that the nth comparison current providing device is part of a second current mirror device. In other embodiment examples, it is provided that the second current mirror device supplies a respective comparison current to a plurality of the comparator devices, for example. In other embodiment examples, the second current mirror device can be configured as a current mirror device comprising one input and an n number of outputs, for example, wherein the second current mirror device can be supplied via its input with an input current, e.g., an (analog, i.e., for example time-continuous and value-continuous) input current to be transformed into a digital output signal, for example, and wherein the second current mirror device outputs at its n number of outputs a respective nth comparison current derived from the input current, for example.

Other embodiment examples of the present invention relate to an analog-to-digital converter device comprising at least one apparatus as described above, wherein the converter device is configured to receive an input current and form a digital output signal based on the input current. One respective comparator device of the apparatus can be used to determine a bit of a corresponding value of the converter device, for example. For this purpose, in other embodiment examples, the current intensities of the reference currents and/or the comparison currents can respectively be appropriately selected for the different comparator devices.

In other embodiment examples of the present invention, it is provided that the converter device is configured to form at least the first or an nth reference current based on a reference current, for example by means of a or the first current mirror device, wherein a current intensity of the nth reference current corresponds to a value of the nth stage of the converter device, for example.

In other embodiment examples of the present invention, it is provided that the converter device is configured to form at least the first or nth comparison current based on the input current, for example by means of a or the second current mirror device, wherein a current intensity of the nth comparison current corresponds to a value of the nth stage of the converter device, for example.

Other embodiment examples of the present invention relate to a method for operating an apparatus comprising a first comparator device, wherein the first comparator device comprises a first reference current providing device and a first comparison current providing device, wherein the method comprises: providing a first reference current by means of the first reference current providing device, providing a first comparison current by means of the first comparison current providing device, comparing the first reference current with the first comparison current to obtain a first comparison result and outputting a first output signal characterizing the first comparison result based on the first comparison result.

In other embodiment examples of the present invention, it is provided that the apparatus comprises at least one second comparator device, wherein the second comparator device comprises a second reference current providing device for providing a second reference current and a second comparison current providing device for providing a second comparison current, and wherein the second comparator device compares the second reference current with the second comparison current to obtain a second comparison result and outputs a second output signal characterizing the second comparison result based on the second comparison result, wherein the second comparator device, for example, receives the first output signal and forms the second comparison result based on the second reference current and the second comparison current and the first output signal.

In other embodiment examples of the present invention, the principle according to the embodiments can similarly also be applied to apparatuses comprising an n number of, n=1, 2, 3, . . . , comparator devices, or to methods for operating such apparatuses.

Other embodiment examples of the present invention relate to a computing device, for example for determining a scalar product, for example a vector matrix multiplier, for example a dot product engine, comprising a matrix of elements with a controllable electrical resistance, and at least one analog-to-digital converter device according to the embodiments.

Other embodiment examples relate to a use of the apparatus according to the embodiments and/or the analog-to-digital converter device according to the embodiments and/or the method according to the embodiments and/or the computing device according to the embodiments for at least one of the following elements: a) converting a current to a binary value, b) performing a binary coding, c) providing a, for example completely, current-driven analog-to-digital converter.

Further features, possible applications and advantages of the present invention emerge from the following description of embodiment examples of the present invention, which are shown in the figures of the figures. All of the described or illustrated features constitute the subject matter of the present invention, either alone or in any combination, regardless of their wording or representation in the description or in the figures.

DETAILED DESCRIPTION OF EXAMPLE EMBODIMENTS

Figure 1:
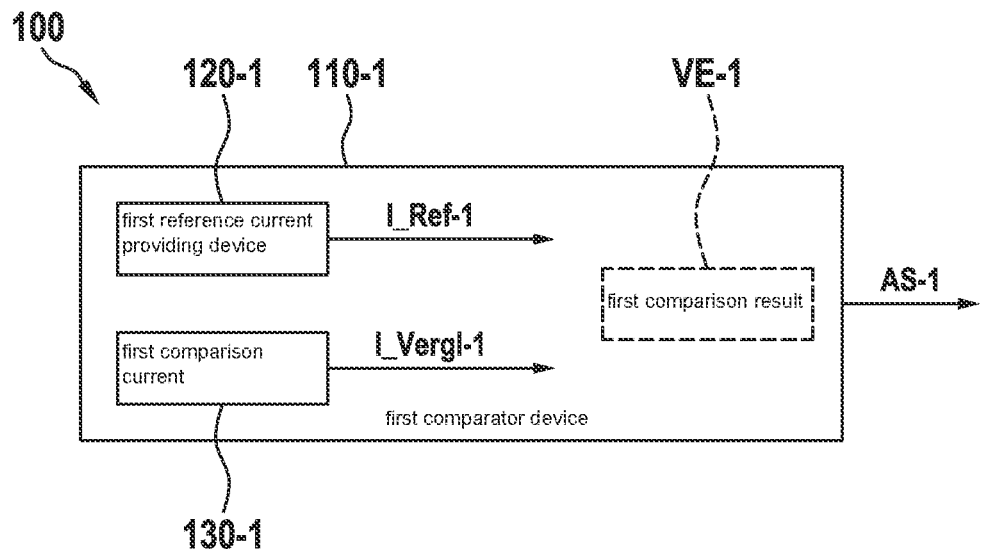
FIG. 1 shows schematically, a simplified block diagram according to embodiment examples of the present invention.
Figure 2:
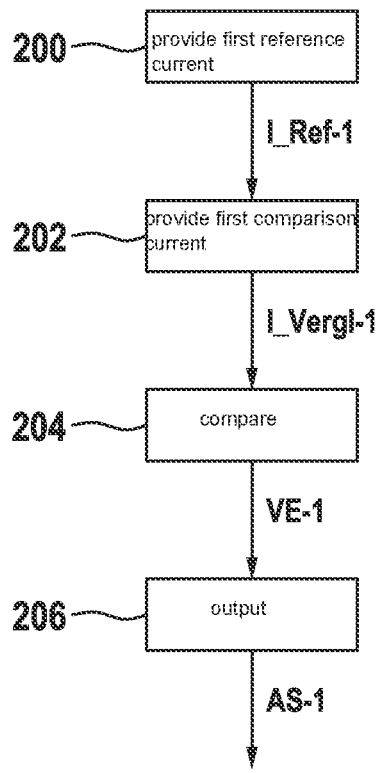
FIG. 2 shows schematically, a simplified flow chart according to embodiment examples of the present invention.

Embodiment examples, see FIGS. 1 and 2, refer to an apparatus 100 comprising a first comparator device 110-1, wherein the first comparator device 110-1 comprises a first reference current providing device 120-1 for providing 200 (FIG. 2) a first reference current I_Ref-1 and a first comparison current providing device 130-1 for providing 202 a first comparison current I_Vergl-1, and wherein the first comparator device 110-1 is configured to compare 204 the first reference current I_Ref-1 with the first comparison current I_Vergl-1 to obtain a first comparison result VE-1 and output 206 a first output signal AS-1 characterizing the first comparison result VE-1 based on the first comparison result VE-1, for example as a binary signal or a logic signal. In other embodiment examples, a chronological sequence of the blocks according to FIG. 2 can also be depicted differently than in the present example, e.g., multiple blocks can be carried out at the same time or at least partially overlapping in terms of time.

Figure 3:
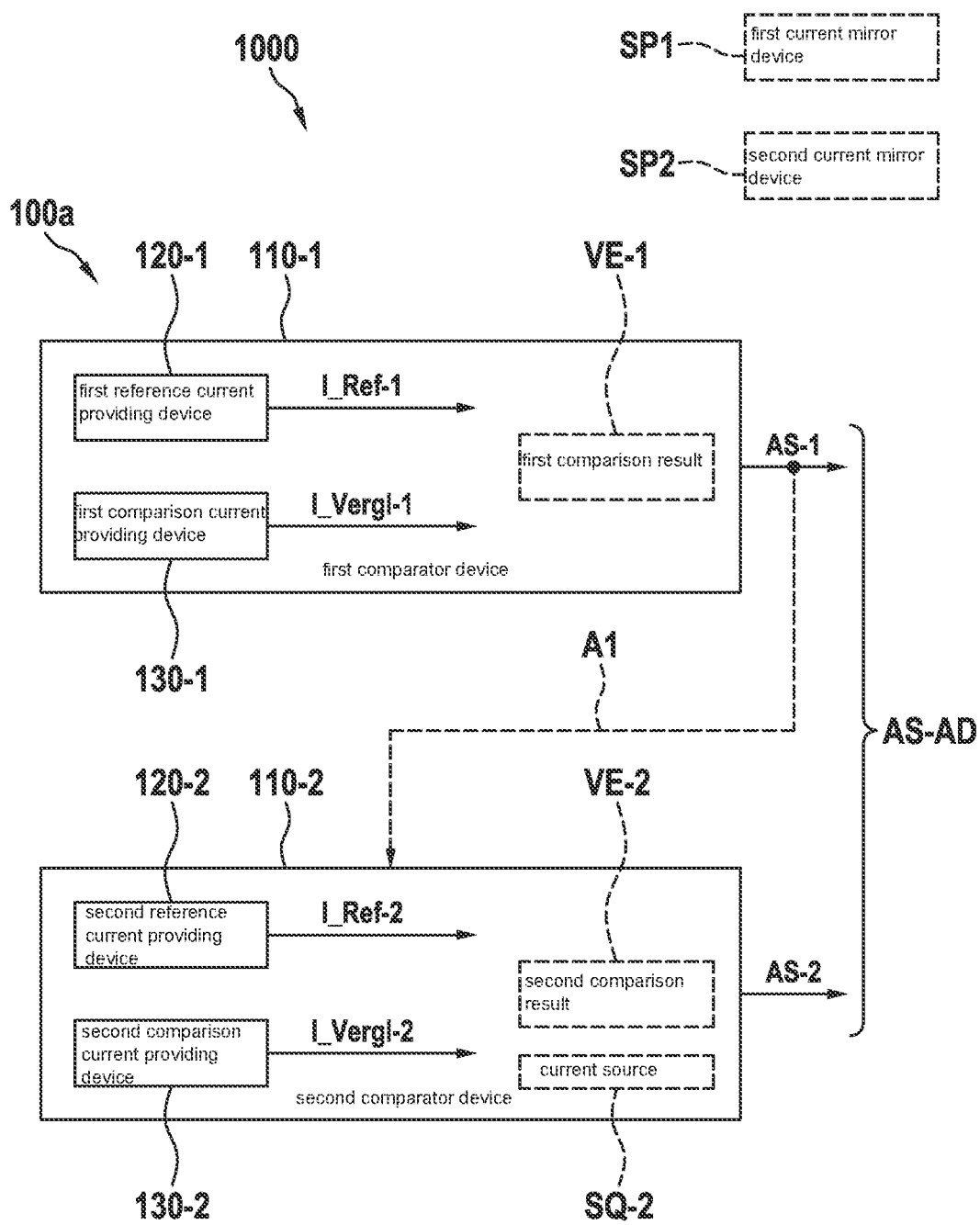
FIG. 3 shows schematically, a simplified block diagram according to embodiment examples of the present invention.
Figure 4:
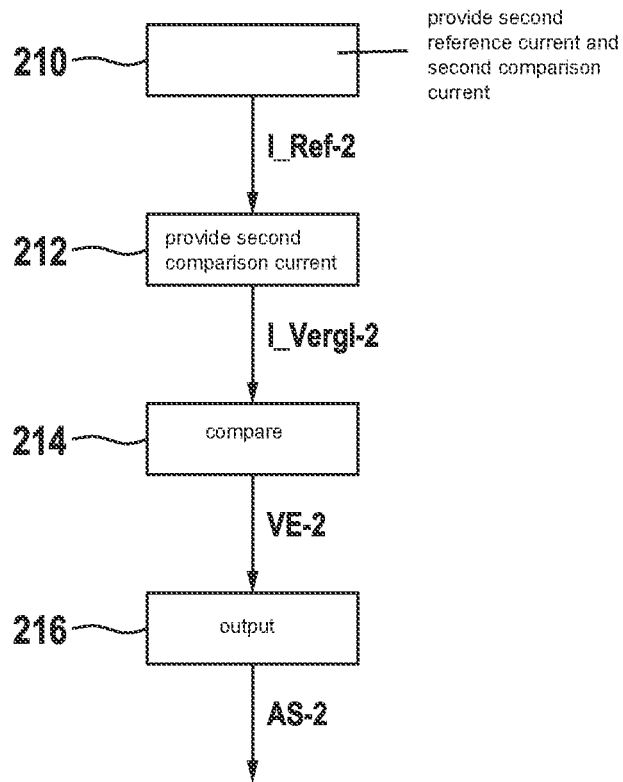
FIG. 4 shows schematically, a simplified flow chart according to embodiment examples of the present invention.

In other embodiment examples, FIG. 3, 4, it is provided that the apparatus 100a comprises at least one second comparator device 110-2, wherein the second comparator device 110-2 comprises a second reference current providing device 120-2 for providing 210 (FIG. 4) a second reference current I_Ref-2 and a second comparison current providing device 130-2 for providing 212 a second comparison current I_Vergl-2, and wherein the second comparator device 110-2 is configured to compare 214 the second reference current I_Ref-2 with the second comparison current I_Vergl-2 to obtain a second comparison result VE-2 and output 216 a second output signal AS-2 characterizing the second comparison result VE-2 based on the second comparison result VE-2.

In other embodiment examples, this makes it possible to provide a, for example two-stage, analog-to-digital converter device 1000, for instance, wherein a first stage, e.g., corresponding to a most significant bit (MSB), can be implemented by means of the first comparator device 110-1, for example, and wherein a second stage, e.g., corresponding to a least significant bit (LSB), can be implemented by means of the second comparator device 110-2, for example. The digital output signal AS-AD of the analog-to-digital converter device 1000 is characterized by the output signals AS-1, AS-2 of the two stages 110-1, 110-2, for example.

For instance, the first reference current I_Ref-1 that can be used for the first comparator device 110-1 associated with the MSB can be selected such that it corresponds to half the maximum current, for example. For instance, the second reference current I_Ref-2 that can be used for the second comparator device 110-2 associated with the LSB can be selected such that it corresponds to a quarter of the maximum current, for example. The provision of the comparison currents I_Vergl-1, I_Vergl-2 for the two stages according to other embodiment examples is described in more detail in the following.

Figure 5:
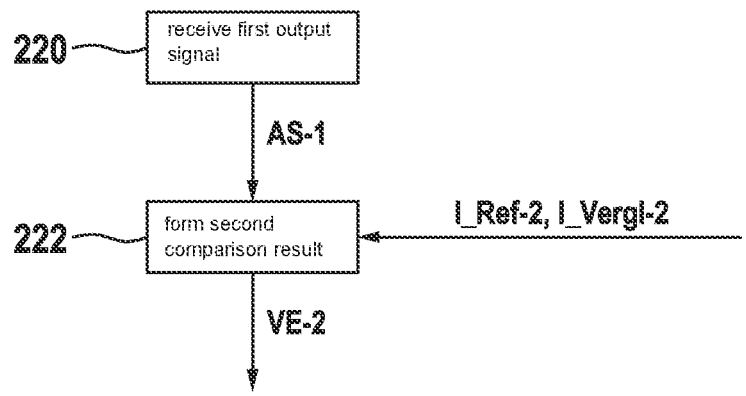
FIG. 5 shows schematically, a simplified flow chart according to embodiment examples of the present invention.

In other embodiment examples, FIG. 3, 5, it is provided that the second comparator device 110-2 is configured to receive the first output signal AS-1, see also Block 220 according to FIG. 5, and to form the second comparison result VE-2 based on the second reference current I_Ref-2 and the second comparison current I_Vergl-2 and the first output signal AS-1, see Block 222 according to FIG. 5, see also the dashed arrow A1 in FIG. 3, which symbolizes a supply of the first output signal AS-1 from the first comparator device 110-1 to the second comparator device 110-2.

Figure 6:
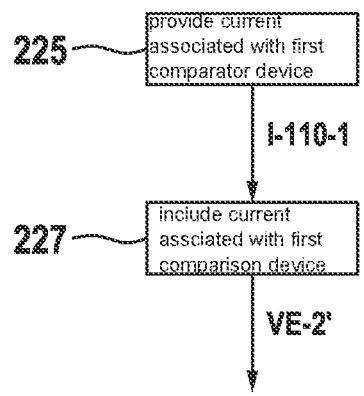
FIG. 6 shows schematically, a simplified flow chart according to embodiment examples of the present invention.

In other embodiment examples, FIG. 6, is provided that the second comparator device 110-2 (FIG. 3) is configured to provide 225 a current I-110-1 associated with the first comparator device 110-1 based on the first output signal AS-1 (FIG. 6) and include 227 the current I-110-1 associated with the first comparator device 110-1 in the comparison 214, 222, wherein the second comparator device 110-2 comprises a current source SQ-2 which can be controlled based on the first output signal AS-1 (FIG. 3), for example, in order to provide 225 the current I-110-1 associated with the first comparator device 110-1. Thus, for example when an analog-to-digital converter device 1000 is provided, a state change, e.g., of the MSB, can be taken into account, e.g., by influencing a current comparison of the LSB stage 120-2 based on the current I-110-1 associated with the first comparator device 110-1.

Figure 7:
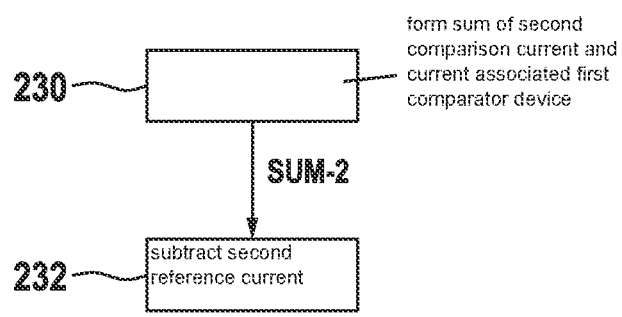
FIG. 7 shows schematically, a simplified flow chart according to embodiment examples of the present invention.

In other embodiment examples, FIG. 7, it is provided that the second comparator device 110-2 is configured to form 230 a sum SUM-2 of the second comparison current I_Vergl-2 and the current I-110-2 associated with the first comparator device 110-1 and to subtract 232 the second reference current I_Ref-2 from the sum SUM-2.

Figure 8:
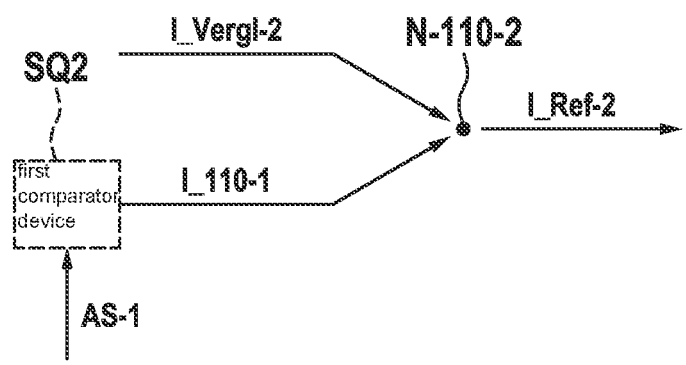
FIG. 8 shows schematically, a simplified wiring diagram according to embodiment examples of the present invention.

In other embodiment examples, FIG. 8, it is provided that the second comparator device 110-2 is configured to supply the second comparison current I_Vergl-2 and the current I-110-1 associated with the first comparator device 110-1 to a circuit node N-110-2 associated with the second comparator device 110-2, and to drain the second reference current I_Ref-2 from the circuit node N-110-2 associated with the second comparator device 110-2. In other embodiment examples, an electrical potential of the circuit node N-110-2 associated with the second comparator device can be used as the second output signal AS-2, for example. In other embodiment examples, this applies similarly also to the first comparator device 110-1, for example, or, in the case of multiple (e.g., more than two) comparator devices, for the multiple comparator devices available, wherein for the MSB alone, for example, a comparison of the two currents I_Ref-1, I_Vergl-1 is carried out (and thus a formation of an electrical potential characterizing the output signal AS-1), i.e., there is no consideration of a further current, as for the LSB, e.g., with the current I-110-1 associated with the MSB, because the MSB already represents the most significant digit position.

Figure 9:
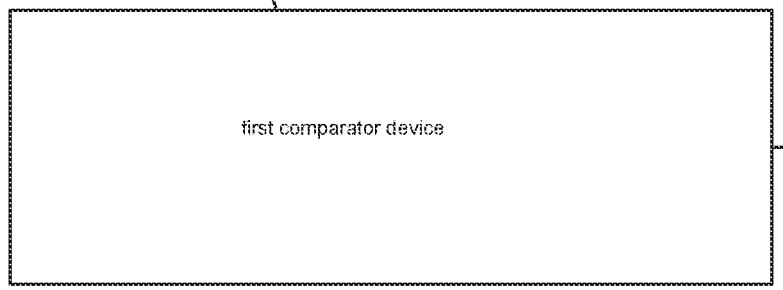
FIG. 9 shows schematically, a simplified block diagram according to embodiment examples of the present invention.
Figure 9:
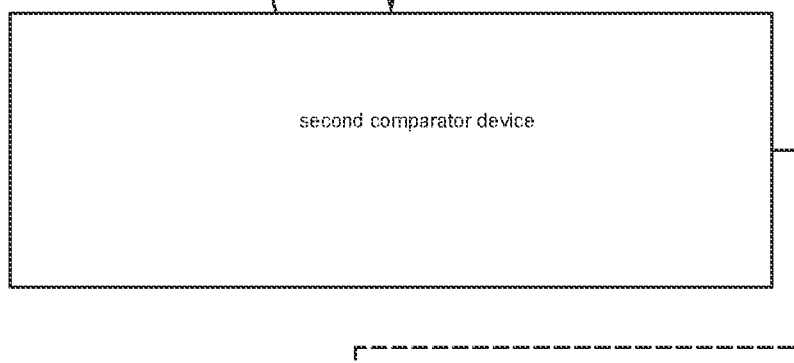
Figure 9:
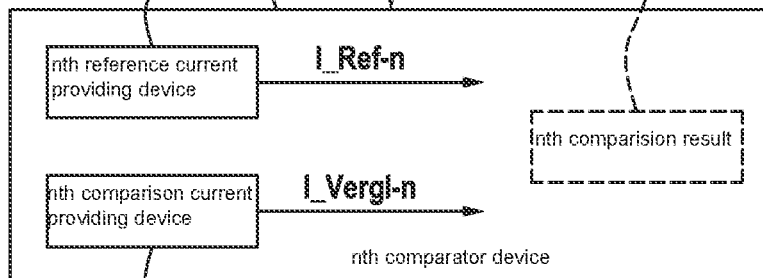
Figure 10:
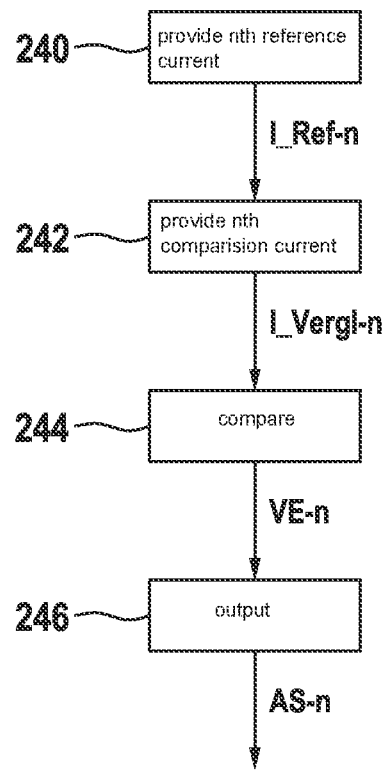
FIG. 10 shows schematically, a simplified flow chart according to embodiment examples of the present invention.

In other embodiment examples, FIG. 9, 10, it is provided that the apparatus 100b comprises an n number of, n=1, 2, 3, . . . , comparator devices 110-1, 110-2, . . . , 110-n (e.g., also comprising the first and/or second comparator device 110-1, 110-2 already mentioned above as examples), wherein the nth comparator device 110-n comprises an nth reference current providing device 120-n for providing an nth reference current I_Ref-n (see Block 240 according to FIG. 10) and an nth comparison current providing device 130-n for providing an nth comparison current I_Vergl-n (see Block 242 according to FIG. 10), and wherein the nth comparator device 110-n is configured to compare (see Block 244 according to FIG. 10) the nth reference current I_Ref-n with the nth comparison current I_Vergl-n to obtain an nth comparison result VE-n and output (see Block 246 according to FIG. 10) an nth output signal AS-n characterizing the nth comparison result VE-n based on the nth comparison result VE-n. In other words, in other embodiment examples, a plurality or all of the comparator devices 110-1, 110-2, . . . , 110-n of the apparatus 100b can therefore have an at least partially identical or comparable structure, for example with regard to the respective reference current providing device and/or the respective comparison current providing device.

Figure 11:
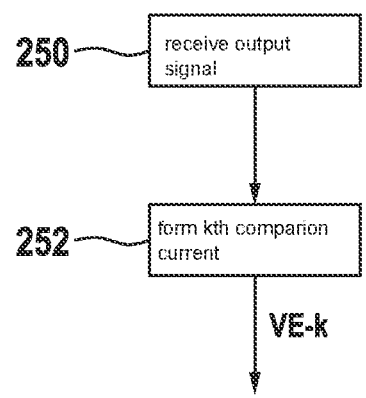
FIG. 11 shows schematically, a simplified flow chart according to embodiment examples of the present invention.

In other embodiment examples, FIG. 11, it is provided in that a kth comparator device, k=2, . . . , n, of the n number of comparator devices is configured to receive 250 at least one output signal of a (k−1)th comparator device and form 252 the kth comparison result VE-k based on the kth reference current and the kth comparison current and the at least one output signal of the (k−1)th comparator device; see for example the arrow A1, which illustrates this as an example for k=2, see for example the arrow A2, which illustrates this as an example for k=3, see for example the arrow An, which illustrates this as an example for k=n. Thus, in other embodiment examples, it is possible to carry out comparisons of some stages or comparator devices based on the state or output signal of at least one other comparator device.

Figure 12:
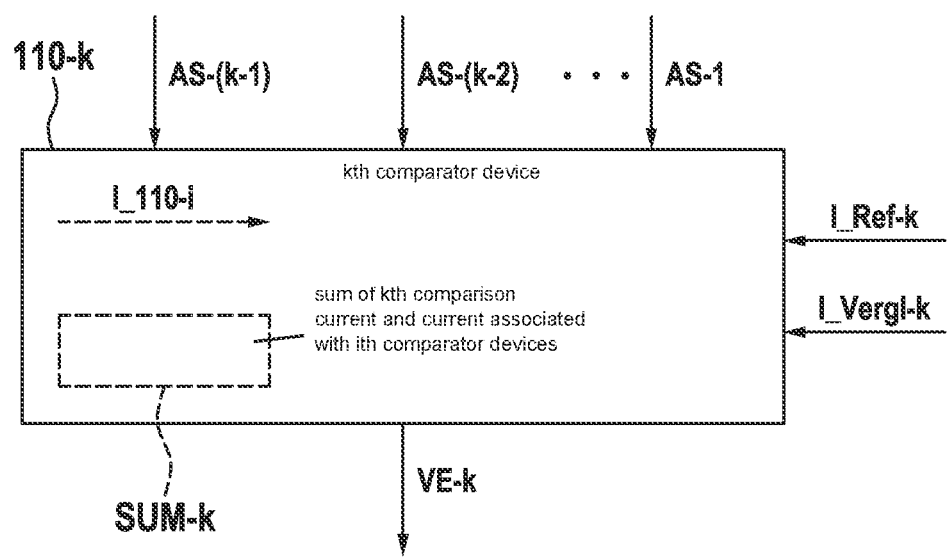
FIG. 12 shows schematically, a simplified block diagram according to embodiment examples of the present invention.
Figure 13:
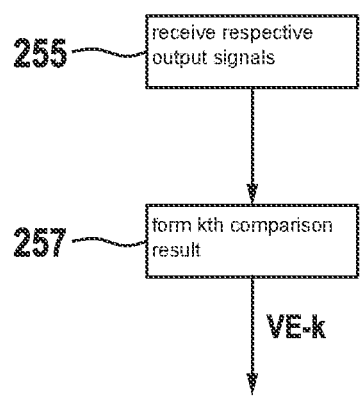
FIG. 13 shows schematically, a simplified flow chart according to embodiment examples of the present invention.

In other embodiment examples, FIG. 12, 13, it is provided that a kth comparator device 110-k, k=2, . . . , n, of the n number of comparator devices is configured to receive 255 respective output signals AS-(k−1), AS-(k−2), . . . , AS-1 of each ith comparator device, i=k−1, k−2, . . . , 1 (FIG. 13) and to form 257 the kth comparison result V-k based on the kth reference current I_Ref-k and the kth comparison current I_Vergl-k and the respective output signals AS-(k−1), AS-(k−2), . . . , AS-1 of each ith comparator device. Thus, in other embodiment examples, it is possible to carry out comparisons of some stages or comparator devices based on the state or output signal of some other stages or comparator devices, for example in applications in the field of analog-to-digital converter devices according to other embodiment examples, based on the state or output signal of such stages of the analog-to-digital converter device which precede the kth stage, e.g., in a sequence of values from MSB to LSB, thus affecting the higher-order stages than the k-stage.

In other embodiment examples, FIG. 12, it is provided that the kth comparator device 110-k (FIG. 12) is configured to provide a current associated with the ith comparator devices based on the respective output signals of each one of the ith comparator devices and include the current associated with the ith comparator devices in the comparison, wherein the kth comparator device, for example, is configured to form a sum SUM-k of the kth comparison current and the current associated with the ith comparator devices and to subtract the kth reference current I_Ref-k from the sum.

Figure 14A:
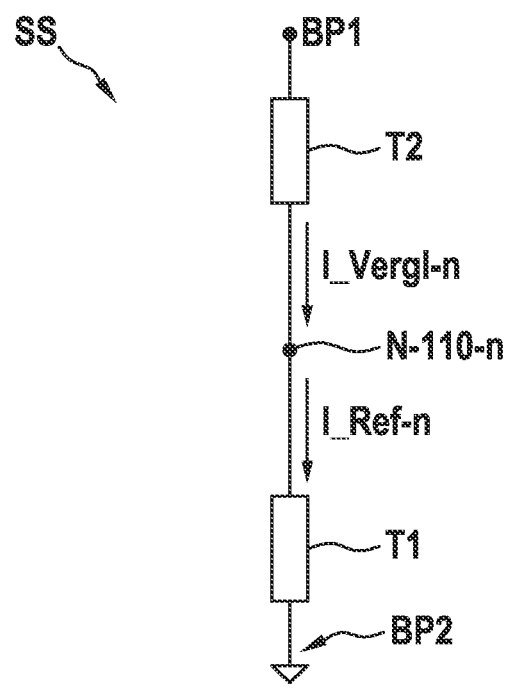
FIG. 14A shows schematically, a simplified circuit diagram according to embodiment examples of the present invention.

In other embodiment examples, FIG. 14A, it is provided that at least one nth comparator device comprises a series circuit SS consisting of a first transistor T1 and a second transistor T2, wherein the first transistor T1 forms at least part of the nth reference current providing device 120-n (FIG. 9) and wherein the17econdd transistor T2 forms at least part of the nth comparison current providing device 130-n. The series circuit SS is connected between a first reference potential BP1, e.g., a supply voltage potential, and a second reference potential BP2, e.g., a ground potential, for instance.

In other embodiment examples, it is provided that the first transistor T1 and/or the second transistor T2 is configured as a field effect transistor, for example a MOSFET, e.g., as an N-channel MOSFET or as a P-channel MOSFET. In other embodiment examples, the drain-source paths of the first transistor T1 and the second transistor T2, for example, are then connected in series in the sense of the series circuit SS described above as an example.

In other embodiment examples, it is provided that the first transistor T1 and/or the second transistor T2 is configured as a, for example NPN or PNP type, bipolar transistor. In other embodiment examples, the collector-emitter paths of the first transistor T1 and the second transistor T2, for example, are then connected in series in the sense of the series circuit SS described above as an example.

Figure 14B:
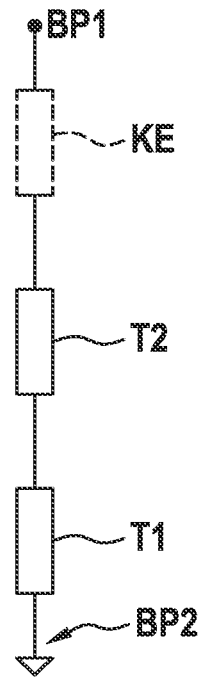
FIG. 14B shows schematically, a simplified circuit diagram according to embodiment examples of the present invention.

In other embodiment examples, FIG. 14B, it is provided that the series circuit SS is assigned a compensation device KE for compensating a voltage drop, for example on the first transistor, wherein the compensation device is connected in series with the series circuit SS, for example (FIG. 14A).

In other embodiment examples, FIG. 14A, 14B, it is provided that a circuit node N-110-$n$ of the series circuit SS located between the first transistor T1 and the second transistor T2 can be at least temporarily subjected to the current associated with the ith comparator devices.

In other embodiment examples, it is provided that the nth reference current providing device 120-$n$ is part of a first current mirror device SP1 (FIG. 3). In other embodiment examples, it is provided that the first current mirror device SP1 supplies a respective reference current I_Ref-1, I_Ref-2, . . . , I_Ref-n to a plurality (for example all) of the comparator devices 110-1, 110-2, . . . , 110-$n$, for example. In other embodiment examples, the first current mirror device SP1 can be configured as a current mirror device comprising one input and an n number of outputs, for example, wherein the first current mirror device SP1 can be supplied via its input with a reference current, e.g., a base reference current, for example, and wherein the first current mirror device SP1 outputs at its n number of outputs a respective nth reference current derived from the reference current, e.g., the base reference current, for example.

In other embodiment examples, it is provided that the nth comparison current providing device 130-$n$ is part of a second current mirror device SP2 (FIG. 3). In other embodiment examples, it is provided that the second current mirror device SP2 supplies a respective comparison current to a plurality (for example all) of the comparator devices 110-1, 110-2, . . . , 110-$n$, for example. In other embodiment examples, the second current mirror device SP2 can be configured as a current mirror device comprising one input and an n number of outputs, for example, wherein the second current mirror device SP2 can be supplied via its input with an input current, e.g., an (analog, i.e., for example time-continuous and value-continuous) input current to be transformed into a digital output signal AS-AD (FIG. 3), for example, and wherein the second current mirror device SP2 outputs at its n number of outputs a respective nth comparison current derived from the input current, for example.

Figure 15:
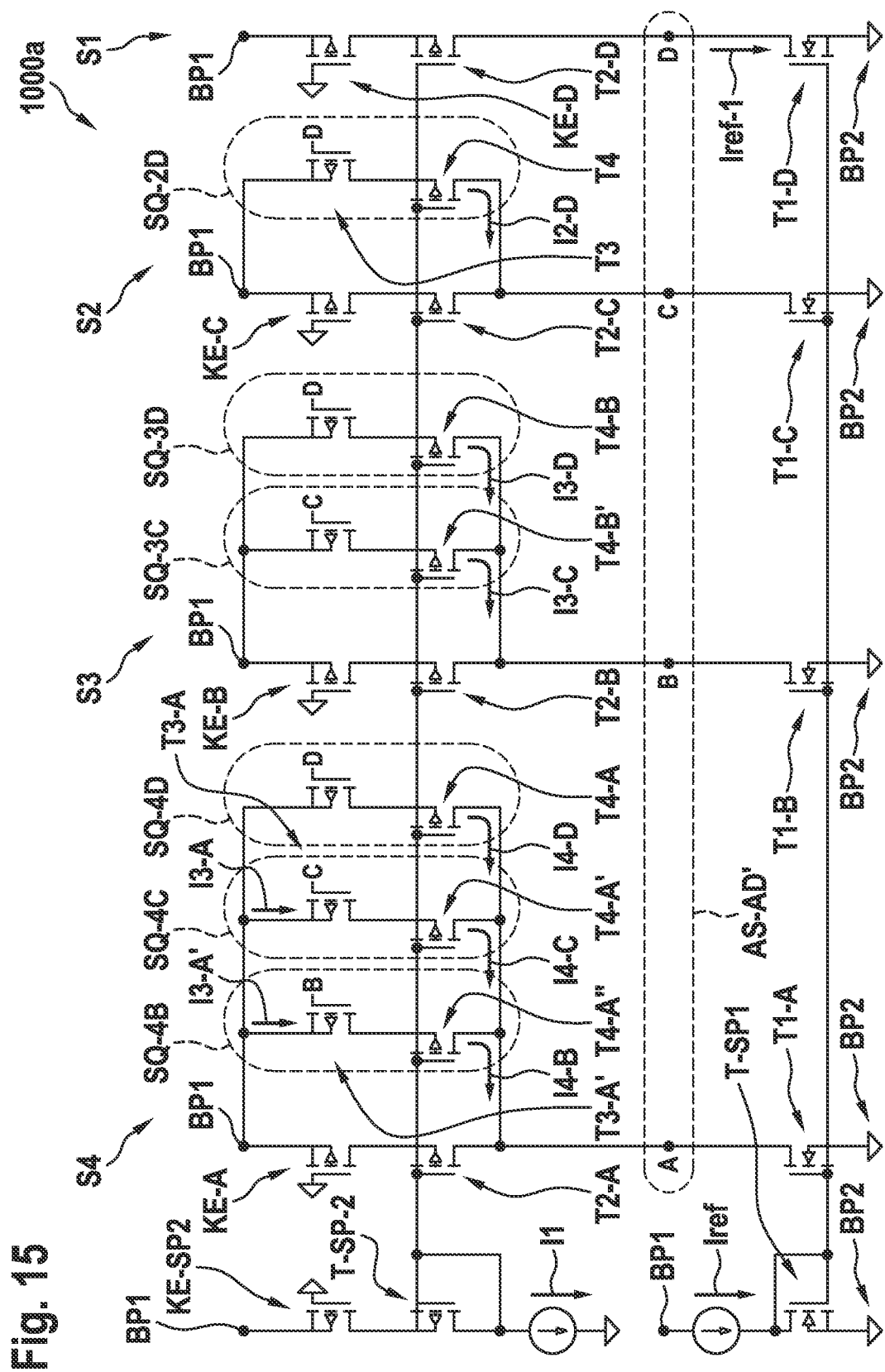
FIG. 15 shows schematically, a simplified circuit diagram according to embodiment examples of the present invention.

Other embodiment examples, FIG. 15, relate to an analog-to-digital converter device 1000$a$ comprising at least one apparatus as described above, wherein the converter device 1000$a$ is configured to receive an input current I1 and form a digital output signal AS-AD' based on the input current. One respective comparator device of the apparatus can be used to determine a bit of a corresponding value of the converter device 1000$a$, for example. For this purpose, in other embodiment examples, the current intensities of the reference currents and/or the comparison currents can respectively be appropriately selected for the different comparator devices, which described in the following as an example with reference to FIG. 15 and can also be applied according to other embodiment examples and without limiting generality to configurations other than those shown as examples in FIG. 15.

The converter device 1000$a$ here comprises four stages S1, S2, S3, S4, of which the first stage S1 characterizes an MSB, for example, and of which the fourth stage S4 characterizes an LSB, for example. An output signal of the first stage S1 is characterized by the potential at the circuit node D, an output signal of the second stage S2 is characterized by the potential at the circuit node C, an output signal of the third stage S3 is characterized by the potential at the circuit node B, an output signal of the fourth stage S4 is characterized by the potential at the circuit node A. Together, the output signals A, B, C, D form the digital output signal AS-AD', which has four bits in the present example.

A comparator device of the first stage S1 is implemented here by means of the two transistors T1-D, T2-D, for example, which in other embodiment examples correspond substantially to the transistors T1, T2 described above with reference to FIG. 14A, 14B, wherein the circuit node D according to FIG. 15 corresponds to the circuit node N-110-$n$ according to FIG. 14A, for example.

In other embodiment examples, it is provided that the converter device 1000$a$ is configured to form at least the first or an nth reference current based on a reference current, e.g., base reference current, Iref, for example by means of a or the first current mirror device SP1 (FIG. 3), wherein a current intensity of the nth reference current corresponds to a value of the nth stage of the converter device, for example. In FIG. 15 here, a first current mirror device is formed by transistors T-SP1, T1-A, T1-B, T1-C, T1-D, wherein the transistor T-SP1 characterizes an input of the first current mirror device, and wherein the transistors T1-A, T1-B, T1-C, T1-D respectively characterize an output for a respective stage of the four stages S1, S2, S3, S4.

In other embodiment examples, it is provided that the converter device 1000$a$ is configured to form at least the first or nth comparison current based on the input current I1, for example by means of a or the second current mirror device (see for example SP2 according to FIG. 3), wherein a current intensity of the nth comparison current corresponds to a value of the nth stage of the converter device, for example. In FIG. 15 here, a second current mirror device is formed by transistors T-SP2, T2-A, T2-B, T2-C, T2-D, wherein the transistor T-SP2 characterizes an input of the second current mirror device, and wherein the transistors T2-A, T2-B, T2-C, T2-D respectively characterize an output for a respective stage of the four stages S1, S2, S3, S4.

In other embodiment examples, a compensation device KE according to FIG. 14B is implemented in the first stage S1 according to FIG. 15 by means of the transistor KE-D. The same applies to the further stages S2, S3, S4 and a transistor T-SP-2 of the second current mirror device SP2 (FIG. 3) for the transistors KE-C, KE-B, KE-A, KE-SP2 according to FIG. 15.

Further example aspects of the embodiment 1000$a$ according to FIG. 15 are described in the following.

First, the first stage S1 with its two transistors T1-D, T2-D which provide the respective currents (reference current of stage S1 provided by the transistor T1-D, comparison current of the stage S1 provided by the transistor T2-D) is considered as an example. The series circuit T1-D, T2-D results in a comparator device, because the transistor T1-D, T2-D which provides the larger current determines the electrical potential at the circuit node D that characterizes the relevant comparison result.

A current I2-D associated with stage S1, which depends on the potential of the circuit node D, for example, is provided to stage S2, namely its circuit node C, via the current source device SQ-2-D. The comparison that can be carried out by the comparator device T1-C, T2-C of stage S2, which determines the potential at the circuit node C, can thus be carried out based on the potential of the circuit node D, i.e., based on the output signal D of the next higher (first) stage S1.

A current I3-D associated with stage S1, which depends on the potential of the circuit node D, for example, is similarly provided to stage S3, namely its circuit node B, via the current source device SQ-3D. The comparison that can be carried out by the comparator device T1-B, T2-B of stage S3, which determines the potential at the circuit node B, can thus be carried out based on the potential of the circuit node D, i.e., based on the output signal D of the first stage S1.

A current I4-D associated with stage S1, which depends on the potential of the circuit node D, for example, is similarly provided to stage S4, namely its circuit node A, via the current source device SQ-4D. The comparison that can be carried out by the comparator device T1-A, T2-A of stage S4, which determines the potential at the circuit node A, can thus be carried out based on the potential of the circuit node D, i.e., based on the output signal D of the first stage S1.

A current I3-C associated with stage S2, which depends on the potential of the circuit node C, for example, is similarly provided to stage S2, namely its circuit node B, via the current source device SQ-3C. The comparison that can be carried out by the comparator device T1-B, T2-B of stage S3, which determines the potential at the circuit node B, can thus also be carried out based on the potential of the circuit node C, i.e., based on the output signal C of the second stage S2.

A current I4-C associated with stage S2, which depends on the potential of the circuit node C, for example, is similarly provided to stage S4, namely its circuit node A, via the current source device SQ-4C. The comparison that can be carried out by the comparator device T1-A, T2-A of stage S4, which determines the potential at the circuit node A, can thus be carried out based on the potential of the circuit node C, i.e., (also) based on the output signal C of the second stage S2.

A current I4-D associated with stage S3, which depends on the potential of the circuit node B, for example, is similarly provided to stage S4, namely its circuit node A, via the current source device SQ-4B. The comparison that can be carried out by the comparator device T1-A, T2-A of stage S4, which determines the potential at the circuit node A, can thus be carried out based on the potential of the circuit node B, i.e., (also) based on the output signal B of the third stage S3.

In other embodiment examples, the current source devices SQ-2D, SQ-3D, SQ-3C, SQ-4D, SQ-4C, SQ-4B thus make it possible to take into account output signals of stages of the converter device 1000a having higher value, wherein the currents I2-D, I3-D, I3-C, I4-D, I4-C, I4-B which can be provided by means of the respective current source devices SQ-2D, SQ-3D, SQ-3C, SQ-4D, SQ-4C, SQ-4B can be used for forming the respective output signal A, B, C, for example.

In other embodiment examples, the current source devices SQ-2D, SQ-3D, SQ-3C, SQ-4D, SQ-4C, SQ-4B each comprise a first MOSFET, for example, the gate electrode of which can be controlled by means of a signal of another stage, and a second MOSFET, e.g., in series with the first MOSFET, which can also form a part of the second current mirror device, for example. This is described as an example in the following for the current source device SQ-2D of stage S2.

The current source device SQ-2D of stage S2 comprises a first MOSFET T3, the gate electrode of which can be controlled by means of the signal D of the MSB stage S1, and a second MOSFET T4, e.g., in series to the first MOSFET T3, which, analogous to the transistor T2-C of stage S2, can also form a part of the second current mirror device, for example. In other embodiment examples, the further current source devices SQ-3D, SQ-3C, SQ-4D, SQ-4C, SQ-4B can all have at least approximately a comparable structure or topology, for example.

As already mentioned, the first stage S1 shown on the right in FIG. 15 forms the MSB, while the fourth stage S4 shown on the left in FIG. 15 forms the LSB.

For an example description of the function of the converter device 1000a, it is assumed in the following that the input current I1 is zero. In this case, all of the output signals A, B, C, D or the electrical potentials or voltages that characterize them, e.g., with reference to the ground potential BP2, are likewise zero. In this state, the third transistors T3 of the current source device SQ-2D, SQ-3D, SQ-3C, SQ-4D, SQ-4C, SQ-4B are switched on, for example, i.e., conductive (e.g., low ohmic). The transistors T1-A, T1-B, T1-C, T1-D that provide the reference currents for stages S1 to S4 are always switched on, for example, because they are provided with a non-zero gate voltage by the input transistor T-SP1 of the first current mirror device.

As already mentioned above, the transistors KE-SP2, KE-A, KE-B, KE-C, KE-D are always switched on, for example, and are used for compensating the voltage drop of the transistors T-SP1, T1-A, T1-B, T1-C, T1-D of their respective stage.

For an example description of the function of the converter device 1000a, it is assumed in the following that an input current is present with a current intensity that is close to the switching threshold of the first stage S1 (MSB). In this state, all stages or bits are '1', except for the MSB of stage S1; the output signal AS-AD' is therefore "1110" in binary. As soon as the input current I1 reaches the switching threshold of the MSB, the MSB assumes the value '1' and the voltage at the circuit node has a value which corresponds to the value '1'. This deactivates the transistors T3 of the current source devices SQ-2D, SQ-3D, SQ-4D, so that the lower-value bits of stages S2, S3, S4 now drive a lower current into their respective comparator device (namely, currents lower by the currents I2-D, I3-D, I4-D, for example), which, for example, causes the low-order bits of stages S2, S3, S4 to change from '1' to '0'.

In other embodiment examples, a design of the switching thresholds or the currents used can be carried out as follows: Setting the threshold current for the MSB, i.e., the first stage S1. The first reference current through the comparator device of the first stage S1 is defined by the transistors T-SP1, T1-D of the first current mirror device. In embodiment examples, the first reference current should correspond to a weight of the MSB, for example, for instance 800 nA (nanoamperes), when a maximum input current range for the converter device 1000a is 1600 nA. In embodiment examples, the first comparison current for the first stage S1 should be set such that it corresponds to the first reference current of, for instance, 800 nA when the input current I1 is 800 nA, which can be implemented, for example, by selecting the ratio of the gate length to the gate width ("W/L ratio") of the respective transistors (e.g., in the case of MOSFETs).

In other embodiment examples, the further, lower-order stages S2, S3, S4 can, for example, be implemented as follows: a) ensure that transistors of the current source devices SQ-2D, SQ-3D, SQ-3C, SQ-4D, SQ-4C, SQ-4B, e.g., transistor T3 for stage S2 are switched off (high-ohmic). This state occurs at a specific input current, for instance for "bit 3" of stage S2, when the output signal changes from "1011" to "1100", which takes place at an input current of 1200 nA when the input current range is 1600 nA, for example. In other embodiment examples, it is advantageous in this state if the current provided by the transistor T2-C corresponds to the current of the transistor T1-C (for example with an appropriate configuration of the W/L ratio of the transistor T2-C). Note that the transistor T3, for example, is switched off.

b) In other embodiment examples, there is a second condition for bit "C" of stage S2, wherein the next transistor T4 provided in stage S2, for example, is activated. When the transistor T4 is active and bit "C" of stage S2 exhibits a change of state, i.e., flips, the input current is 400 nA, for instance, corresponding to a transition of the output signal from "0011" to "0100". In this state, the current which should correspond to the reference current of stage S2 flows through the two transistors T2-C and T4.

In other embodiment examples, a W/L ratio of the transistor T2-C has already been determined in the above-described aspect a). In other embodiment examples, it can be determined what current the transistor T2-C contributes at an input current of 400 nA, for example. For example, this is, for instance exactly, ⅓ of the total current flowing through the comparator device of stage S2 at an input current of 400 nA. The further transistor T4 should therefore provide the differential current to said 400 nA, such that the W/L ratio of the transistor T4, for example, is twice the W/L ratio of the transistor T2-C.

In other embodiment examples, the further transistors T2-A, T2-B and the respective fourth transistors (i.e., the lower in FIG. 15) of the current source devices SQ-4B, SQ-4C, SQ-4D, SQ-3C, SQ-3D can be scaled or designed based on the above-described aspects.

If the transistor T-2D has a W/L ratio of one, for example, the W/L ratio provided for the other transistors can be: T2-C: 0.33; T4: 0.66; T4-B: 0.76; T4-B': 0.23; T4-A: 0.08; T3-A: 0.03; T3-A': 0.014; T2-A: 0.062, wherein it is assumed as an example that the reference branch for the MSB is set to a predeterminable reference current Iref-1, that the reference branch of stage S2 is set to half the predeterminable reference current Iref-1, that the reference branch of stage S3 is set to a quarter of the predeterminable reference current Iref-1 and that the reference branch of stage S1 is set to an eighth of the predeterminable reference current Iref-1.

In other embodiment examples, the W/L ratios can be increased, for instance if they were to become too small, for example by increasing the reference current for a considered stages. In that case, the W/L ratios of the other transistors of the same stage can likewise be scaled. For example, if a reference current through the transistor T1-A of stage S4 is to be doubled, the W/L ratio for the other transistors T2-A, T4-A, T4-A', T4-A" of the same stage can likewise be doubled.

In other embodiment examples, for instance if a width or other structural size of the considered transistors becomes too small, for example for a specific production technology of a target system, it can be provided that a length of a gate channel of the considered transistors is increased, e.g., to obtain a desired W/L ratio.

In other embodiment examples, the converter device 1000a according to FIG. 15 (just like all other apparatuses described above as examples) can be implemented by means of an inverse circuit, for example by vertically mirroring the circuit according to FIG. 15 and replacing NMOS transistors with PMOS transistors, and vice versa.

In other embodiment examples, the outputs A, B, C, D of the comparator devices of stages S1, S2, S3, S4 can be extended with respective buffer circuits (not shown), the outputs of which can then act on the respective current source devices SQ-2D, SQ-3D, . . . of the downstream stages, for example, which can, for instance, improve stability and reduce interference (e.g., glitches).

In other embodiment examples, (not depicted) resistors can be provided, for example in the region of the gate electrodes of at least some transistors, to counteract an undesirable tendency to oscillate.

Other embodiment examples, see e.g., FIG. 1, 2, relate to a method for operating an apparatus 100 comprising a first comparator device 110-1, wherein the first comparator device comprises a first reference current providing device and a first comparison current providing device, wherein the method comprises: providing 200 a first reference current I_Ref-1 by means of the first reference current providing device, providing 202 a first comparison current I_Vergl-1 by means of the first comparison current providing device, comparing 204 the first reference current with the first comparison current to obtain a first comparison result VE-1 and outputting 206 a first output signal AS-1 characterizing the first comparison result VE-1 based on the first comparison result VE-1.

In other embodiment examples, FIG. 3, 4, it is provided that the apparatus 100a comprises at least one second comparator device 110-2, wherein the second comparator device comprises a second reference current providing device for providing a second reference current and a second comparison current providing device for providing a second comparison current, and wherein the29econdd comparator device compares the second reference current with the second comparison current to obtain a second comparison result and outputs a second output signal characterizing the second comparison result based on the second comparison result, wherein the second comparator device, for example, receives the first output signal and forms the second comparison result based on the second reference current and the second comparison current and the first output signal.

In other embodiment examples, the principle according to the embodiments can similarly also be applied to apparatuses comprising an n number of, n=1, 2, 3, . . . , comparator devices, or to methods for operating such apparatuses, see e.g., FIG. 9.

Figure 16:
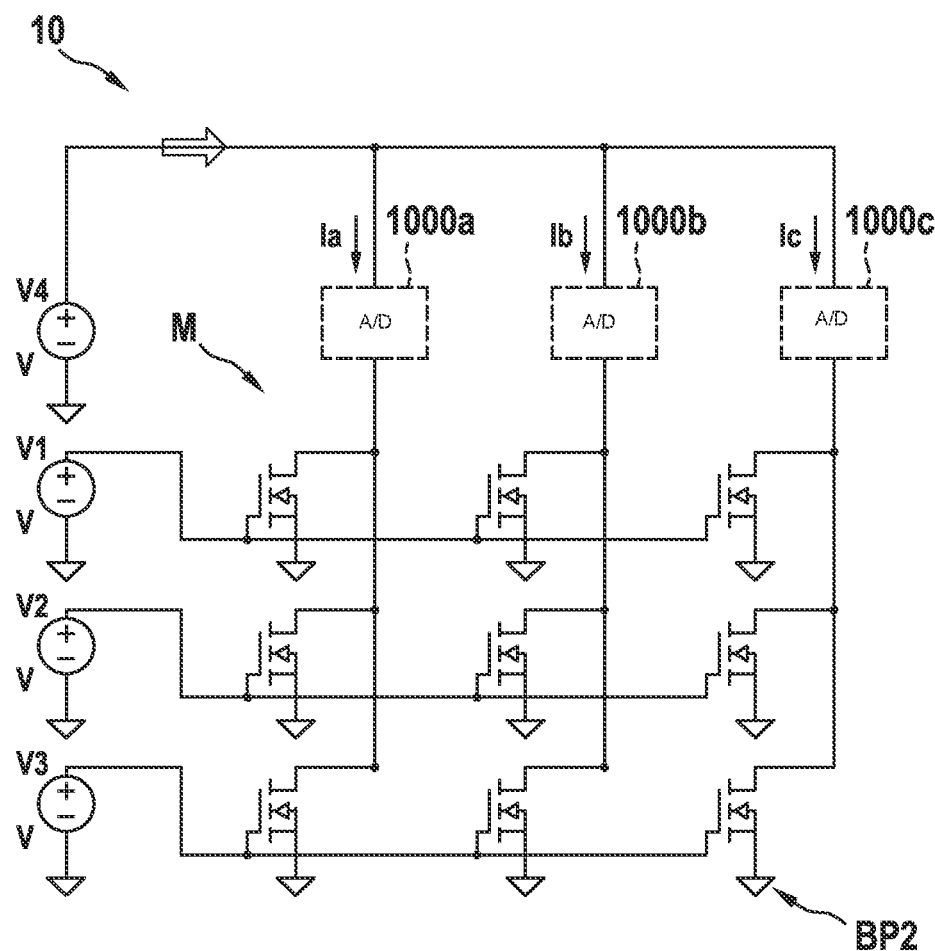
FIG. 16 shows schematically, a simplified circuit diagram according to embodiment examples of the present invention.

Other embodiment examples, FIG. 16, relate to a computing device 10, for example for determining a scalar product, for example a vector matrix multiplier, for example a dot product engine, comprising a matrix M of elements with a controllable electrical resistance, and at least one analog-to-digital converter device 1000a, 1000b, 1000c according to the embodiments.

According to embodiment examples, the at least one analog-to-digital converter device 1000a, 1000b, 1000c can be used for current measurement with respect to at least one column of the matrix M, for example; compare the currents Ia, Ib, Ic, in particular on a "high side", i.e., in the range of a comparatively high electrical potential, for example of an operating voltage potential different from a ground potential BP2, see the voltage source V4.

In other embodiment examples, the computing device 10 can be used for machine learning (ML) methods or artificial intelligence applications, for instance, for example for hardware accelerators for training deep neural networks (DNN).

Figure 17:
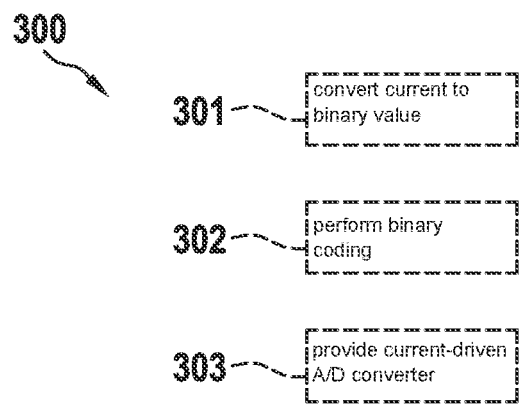
FIG. 17 shows schematically, aspects of uses according to embodiment examples of the present invention.

Other embodiment examples, FIG. 17, relate to a use 300 of the apparatus 100, 100a, 100b according to the embodiments and/or the analog-to-digital converter device 1000, 1000a, 1000b, 1000c according to the embodiments and/or the method according to the embodiments and/or the computing device 10 according to the embodiments for at least one of the following elements: a) converting 301 a current I1 (FIG. 15) to a binary value AS-AD', b) performing 302 a binary coding, c) providing 303 a, for example completely, current-driven analog-to-digital converter.

INFORMATION REGARDING FUNDING AND SUPPORT

The project that led to this application was funded by the ECSEL Joint Undertaking (JU) under Grant Agreement No. 826655. The JU receives support through the Horizon 2020 research and innovation program of the European Union and Belgium, France, Germany, Netherlands, Switzerland.

What is claimed is:

1. An apparatus, comprising:
    a first comparator device including a first reference current providing device configured to provide a first reference current and a first comparison current providing device configured to provide a first comparison current;
    wherein the first comparator device is configured to compare the first reference current with the first comparison current to obtain a first comparison result and output a first output signal characterizing the first comparison result based on the first comparison result;
    at least one second comparator device including a second reference current providing device configured to provide a second reference current and a second comparison current providing device configured to provide a second comparison current;
    wherein the second comparator device is configured to compare the second reference current with the second comparison current to obtain a second comparison result and output a second output signal characterizing the second comparison result based on the second comparison result;
    wherein the second comparator device is configured to receive the first output signal and to form the second comparison result based on the second reference current and the second comparison current and the first output signal;
    wherein the second comparator device is configured to provide a current associated with the first comparator device based on the first output signal and to include the current associated with the first comparator device in the comparison of the second reference current with the second comparison current, wherein the second comparator device includes a current source which can be controlled based on the first output signal to provide the current associated with the first comparator device.

2. The apparatus according to claim 1, wherein the second comparator device is configured to form a sum of the second comparison current and the current associated with the first comparator device and to subtract the second reference current from the sum.

3. The apparatus according to claim 1, wherein the second comparator device is configured to supply the second comparison current and the current associated with the first comparator device to a circuit node associated with the second comparator device and to drain the second reference current from the circuit node associated with the second comparator device.

4. The apparatus according to claim 1, wherein the apparatus is used to at least one of: a) convert a current to a binary value, b) perform a binary coding, c) provide a completely, current-driven analog-to-digital converter.

5. An apparatus comprising:
    an n number of comparator devices, n being at least 1,
    wherein the nth comparator device includes an nth reference current providing device configured to provide an nth reference current and an nth comparison current providing device configured to provide an nth comparison current, the nth comparator device being configured to compare the nth reference current with the nth comparison current, to obtain an nth comparison result and output an nth output signal characterizing the nth comparison result based on the nth comparison result;
    wherein a kth comparator device of the n number of comparator devices is configured to receive respective output signals of each ith comparator device, $i=k-1$, and to form the kth comparison result based on the kth reference current and the kth comparison current and the respective output signals of each ith comparator device, wherein k is at least 2;
    wherein the kth comparator device is configured to provide a current associated with the ith comparator devices based on the respective output signals of each one of the ith comparator devices and include the current associated with the ith comparator devices in the comparison, wherein the kth comparator device is configured to form a sum of the kth comparison current and the current associated with the ith comparator devices and to subtract the kth reference current from the sum of the kth comparison current and the current associated with the ith comparator devices.

6. The apparatus according to claim 5, wherein at least one nth comparator device includes a series circuit including a first transistor and a second transistor, wherein the first transistor forms at least part of the nth reference current providing device, and wherein the second transistor forms at least part of the nth comparison current providing device.

7. The apparatus according to claim 6, wherein the series circuit is assigned a compensation device configured to compensate a voltage drop, wherein the compensation device is connected in series with the series circuit.

8. The apparatus according to claim 6, wherein a circuit node of the series circuit located between the first transistor and the second transistor is at least temporarily subjected to the current associated with the ith comparator devices.

9. An apparatus, comprising:
    an n number of comparator devices, n being at least 1,
    wherein the nth comparator device includes an nth reference current providing device configured to provide an nth reference current and an nth comparison current providing device configured to provide an nth comparison current, the nth comparator device being configured to compare the nth reference current with the nth comparison current, to obtain an nth comparison result and output an nth output signal characterizing the nth comparison result based on the nth comparison result;
    wherein the nth reference current providing device is part of a first current mirror device.

10. The apparatus according to claim 9, wherein a kth comparator device of the n number of comparator devices is configured to receive at least one output signal of a (k−1)th comparator device and to form the kth comparison result based on the kth reference current and the kth comparison current and the at least one at least one output signal of the (k−1)th comparator device, wherein k is at least 2.

11. The apparatus according to claim 9, wherein a kth comparator device of the n number of comparator devices is configured to receive respective output signals of each ith comparator device, i=k−1, and to form the kth comparison result based on the kth reference current and the kth comparison current and the respective output signals of each ith comparator device, wherein k is at least 2.

12. An apparatus, comprising:
an n number of comparator devices, n being at least 1, wherein the nth comparator device includes an nth reference current providing device configured to provide an nth reference current and an nth comparison current providing device configured to provide an nth comparison current, the nth comparator device being configured to compare the nth reference current with the nth comparison current, to obtain an nth comparison result and output an nth output signal characterizing the nth comparison result based on the nth comparison result;
wherein the nth comparison current providing device is part of a second current mirror device.

13. An analog-to-digital converter device, comprising:
at least one apparatus, including:
an n number of comparator devices, n being at least 1, wherein the nth comparator device includes an nth reference current providing device configured to provide an nth reference current and an nth comparison current providing device configured to provide an nth comparison current, the nth comparator device being configured to compare the nth reference current with the nth comparison current, to obtain an nth comparison result and output an nth output signal characterizing the nth comparison result based on the nth comparison result,
wherein the converter device is configured to receive an input current and to form a digital output signal based on the input current;
wherein the converter device is configured to form at least the nth reference current based on a reference current using a first current mirror device, wherein a current intensity of the nth reference current corresponds to a value of an nth stage of the converter device.

14. The converter device according to claim 13, wherein the converter device is configured to form at least an nth comparison current based on the input current, using a second current mirror device, wherein a current intensity of the nth comparison current corresponds to a value of the nth stage of the converter device.

15. A computing device for determining a scalar product including a vector matrix multiplier or a dot product engine, the computing device comprising:
a matrix of elements with a controllable electrical resistance; and
at least one analog-to-digital converter device including:
at least one apparatus, including:
an n number of comparator devices, n being at least 1, wherein the nth comparator device includes an nth reference current providing device configured to provide an nth reference current and an nth comparison current providing device configured to provide an nth comparison current, the nth comparator device being configured to compare the nth reference current with the nth comparison current, to obtain an nth comparison result and output an nth output signal characterizing the nth comparison result based on the nth comparison result,
wherein the converter device is configured to receive an input current and to form a digital output signal based on the input current.

* * * * *